(12) United States Patent
Kim

(10) Patent No.: US 11,769,454 B2
(45) Date of Patent: Sep. 26, 2023

(54) DISPLAY PANEL AND DISPLAY DEVICE HAVING EMISSION CONTROL DRIVER

(71) Applicant: LG Display Co., Ltd., Seoul (KR)

(72) Inventor: Yeonkyung Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/895,907

(22) Filed: Aug. 25, 2022

(65) Prior Publication Data
US 2023/0075599 A1   Mar. 9, 2023

(30) Foreign Application Priority Data

Sep. 3, 2021 (KR) .......................... 10-2021-0117572
Dec. 31, 2021 (KR) .......................... 10-2021-0194720

(51) Int. Cl.
G09G 3/3233   (2016.01)
G09G 3/3266   (2016.01)
H10K 59/126   (2023.01)

(52) U.S. Cl.
CPC .......... *G09G 3/3233* (2013.01); *G09G 3/3266* (2013.01); *H10K 59/126* (2023.02); *G09G 2300/0819* (2013.01); *G09G 2300/0852* (2013.01); *G09G 2300/0861* (2013.01); *G09G 2310/0291* (2013.01); *G09G 2330/021* (2013.01)

(58) Field of Classification Search
CPC ............... G09G 3/3233; G09G 3/3266; G09G 2300/0819; G09G 2300/0852; G09G 2300/0861; G09G 2310/0291; H01L 27/3272
See application file for complete search history.

(56) References Cited

U.S. PATENT DOCUMENTS

| 10,573,225 | B2 | 2/2020 | Lee et al. | |
| 2017/0069283 | A1* | 3/2017 | You | G09G 3/2022 |
| 2017/0206826 | A1* | 7/2017 | Kong | G09G 3/20 |
| 2020/0043404 | A1* | 2/2020 | Yu | G09G 3/3266 |
| 2020/0265789 | A1* | 8/2020 | Park | G09G 3/3291 |
| 2022/0148511 | A1* | 5/2022 | Kim | G09G 3/3233 |
| 2022/0158036 | A1* | 5/2022 | Yamaguchi | G09F 9/30 |

FOREIGN PATENT DOCUMENTS

| KR | 10-2018-0036893 A | 4/2018 | |
| WO | WO-2021024722 A1 * | 2/2021 | ......... H01L 25/0753 |

* cited by examiner

*Primary Examiner* — Benjamin C Lee
*Assistant Examiner* — Nathan P Brittingham
(74) *Attorney, Agent, or Firm* — Birch, Stewart, Kolasch & Birch, LLP

(57) ABSTRACT

A display panel and a display device having an emission control driver are discussed. The display device can include a display panel for displaying an image through sub pixels, and an emission control driver configured to supply a plurality of emission control signals to the sub pixels. The emission control driver can include a plurality of emission control stages configured to supply the plurality of emission control signals, respectively. Each emission control stage can include an output buffer including a first pull-up transistor configured to output a first high potential power supply voltage to an output line by a Q node, and a first pull-down transistor configured to output a first low potential power supply voltage to the output line by a QB node.

19 Claims, 13 Drawing Sheets

DISPLAY PANEL AND DISPLAY DEVICE HAVING EMISSION CONTROL DRIVER

CROSS-REFERENCE TO RELATED APPLICATIONS

This application claims the priority benefit of the Korean Patent Application No. 10-2021-0117572 filed on Sep. 3, 2021 in the Republic of Korea and Korean Patent Application No. 10-2021-0194720 filed on Dec. 31, 2021 in the Republic of Korea, the entire contents of all these applications being hereby expressly incorporated by reference into the present application.

BACKGROUND

Technical Field

The present disclosure relates to an emission control driver, a display panel, and a display device capable of lowering power consumption and reducing a bezel area.

Description of the Related Art

A light emitting display device uses a self-emission device configured to emit light through the use of organic light emitting layer by a recombination of electrons and holes so that it is possible to realize advantages of high luminance, low driving voltage, ultra-thin profile, and freedom in shape.

The light emitting display device includes a panel for displaying an image through a pixel matrix, and a driving circuit for driving the panel. Each of pixels constituting the pixel matrix is independently driven by a thin film transistor TFT.

A gate driver for controlling the thin film transistor TFT of the pixels can be disposed in a bezel area of the display panel. The gate driver can include a plurality of scan drivers for controlling a switching thin film transistor TFT in each pixel, and a light emitting control driver for controlling a light emitting control thin film transistor TFT.

In order to reduce a bezel area of the display panel, a reduction in a circuit configuration of the gate driver is desired. Further, it is desirable to reduce power consumption of the display device.

The disclosure of the above-described background art is owned by the inventor of the present disclosure to devise the present disclosure or is technical information acquired by a process of devising the present disclosure, but may not be regarded as the known art disclosed to the general public before the present disclosure is disclosed.

SUMMARY OF THE DISCLOSURE

The present disclosure has been made in view of the above problems and other limitations associated with the related art, and one or more aspects of the present disclosure provides an emission control driver, a display panel, and a display device capable of reducing a bezel area and lowering power consumption.

In addition to the technical benefits of the present disclosure as mentioned above, additional technical benefits and features of the present disclosure will be clearly understood by those skilled in the art from the following description of the present disclosure.

In accordance with an aspect of the present disclosure, a display device can include a display panel configured to display an image through sub pixels and an emission control driver configured to supply a plurality of emission control signals to the sub pixels, wherein the emission control driver can include a plurality of emission control stages configured to supply the plurality emission control signals, respectively. Each of the plurality of emission control stages can include an output buffer including a first pull-up transistor configured to output a first high potential power supply voltage to an output line by the control of a first control node (hereinafter, referred to as a Q node), and a first pull-down transistor configured to output a first low potential power supply voltage to the output line by the control of a second control node (hereinafter, referred to as a QB node), a charge/discharge part configured to charge and discharge the Q node by the use of charge/discharge signal in response to a clock signal, an inverter configured to charge and discharge the QB node to be opposite to the Q node, a first back bias circuit configured to apply a back bias voltage to a light shielding layer of at least one transistor of the output buffer through a first back bias node capacitance-coupled to the Q node, and a second back bias circuit configured to apply the back bias voltage to a light shielding layer of at least one transistor of the inverter through a second back bias node capacitance-coupled to the QB node.

The first back bias circuit can include the first back bias node connected to the light shielding layer of the first pull-up transistor of the output buffer, a first capacitor connected between the Q node and the output line, and a first back bias transistor configured to initialize the first back bias node to a second low potential power supply voltage, which is lower than the first low potential power voltage, during a vertical blank period of each frame by the control of a stabilization signal, and float the first back bias node during an active period of each frame.

The output buffer further can include a second pull-up transistor configured to output a second high potential power supply voltage to a carry output line by the control of the Q node, and a second pull-down transistor configured to output the first low potential power supply voltage to the carry output line by the control of the QB node, wherein the first back bias node is connected to the light shielding layer of the second pull-up transistor.

The second back bias circuit can include the second back bias node connected to the light shielding layer of the charge transistor in the inverter, a second capacitor connected between the QB node and the second back bias node, and a second back bias transistor for initializing the second back bias node to the second low potential power supply voltage during the vertical blank period by the control of the stabilization signal, and floating the second back bias node during the active period.

The charge/discharge part can include a pair of charge/discharge transistors controlled by the clock signal supplied through a clock line, and connected in series between the Q node and an input line to which the charging/discharging signal is supplied, wherein the charge/discharge signal can be supplied with any one of the carry output of the preceding emission control stage and a start pulse.

Each emission control stage can further include a leakage prevention part having a charge transistor controlled by the Q node and configured to charge the second high potential power supply voltage to an intermediate node between the pair of charge/discharge transistors and a third control node of the inverter.

The inverter can include a pair of charge transistors connected in a diode structure between a second power line to which the second high potential power supply voltage is supplied and the QB node in series, and a discharge transistor controlled by the third control node and connected between the QB node and a third power line supplied with the first low potential power supply voltage, wherein the second back bias node is connected to a light shielding layer in each of the pair of charge transistors of the inverter.

In accordance with another aspect of the present disclosure, a display panel can include a display area configured to display an image through sub pixels, a bezel area surrounding the display area, a first scan driver embedded in the bezel area and configured to supply a plurality of first scan signal to a plurality of first gate lines connected to the sub pixels, a second scan driver embedded in the bezel area and configured to supply a plurality of second scan signal to a plurality of second gate lines connected to the sub pixels, and an emission control driver embedded in the bezel area and configured to supply a plurality of emission control signal to a plurality of third gate lines connected to the sub pixels, wherein the emission control driver includes a plurality of emission control stages configured to supply the plurality emission control signals, respectively. Each of the plurality of emission control stages can include an output buffer including a first pull-up transistor configured to output a first high potential power supply voltage to an output line by the control of a first control node (hereinafter, referred to as a Q node), a second pull-up transistor configured to output a second high potential power supply voltage to a carry output line by the control of the Q node, a first pull-down transistor configured to output a first low potential power supply voltage to the output line by the control of a second control node (hereinafter, referred to as a QB node), and a second pull-down transistor configured to output the first low potential power supply voltage to the carry output line by the control of the QB node. Each of the plurality of emission control stages can further include a charge/discharge part configured to charge and discharge the Q node by the use of charge/discharge signal in response to a clock signal, an inverter configured to charge and discharge the QB node to be opposite to the Q node, a first back bias circuit configured to apply a back bias voltage to a light shielding layer of at least one transistor of the output buffer through a first back bias node capacitance-coupled to the Q node, and a second back bias circuit configured to apply the back bias voltage to a light shielding layer of at least one transistor of the inverter through a second back bias node capacitance-coupled to the QB node.

In addition to the features of the present disclosure as mentioned above, additional technical benefits and features of the present disclosure will be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principles of the disclosure.

In the drawings.

DETAILED DESCRIPTION OF THE EMBODIMENTS

Figure 1:
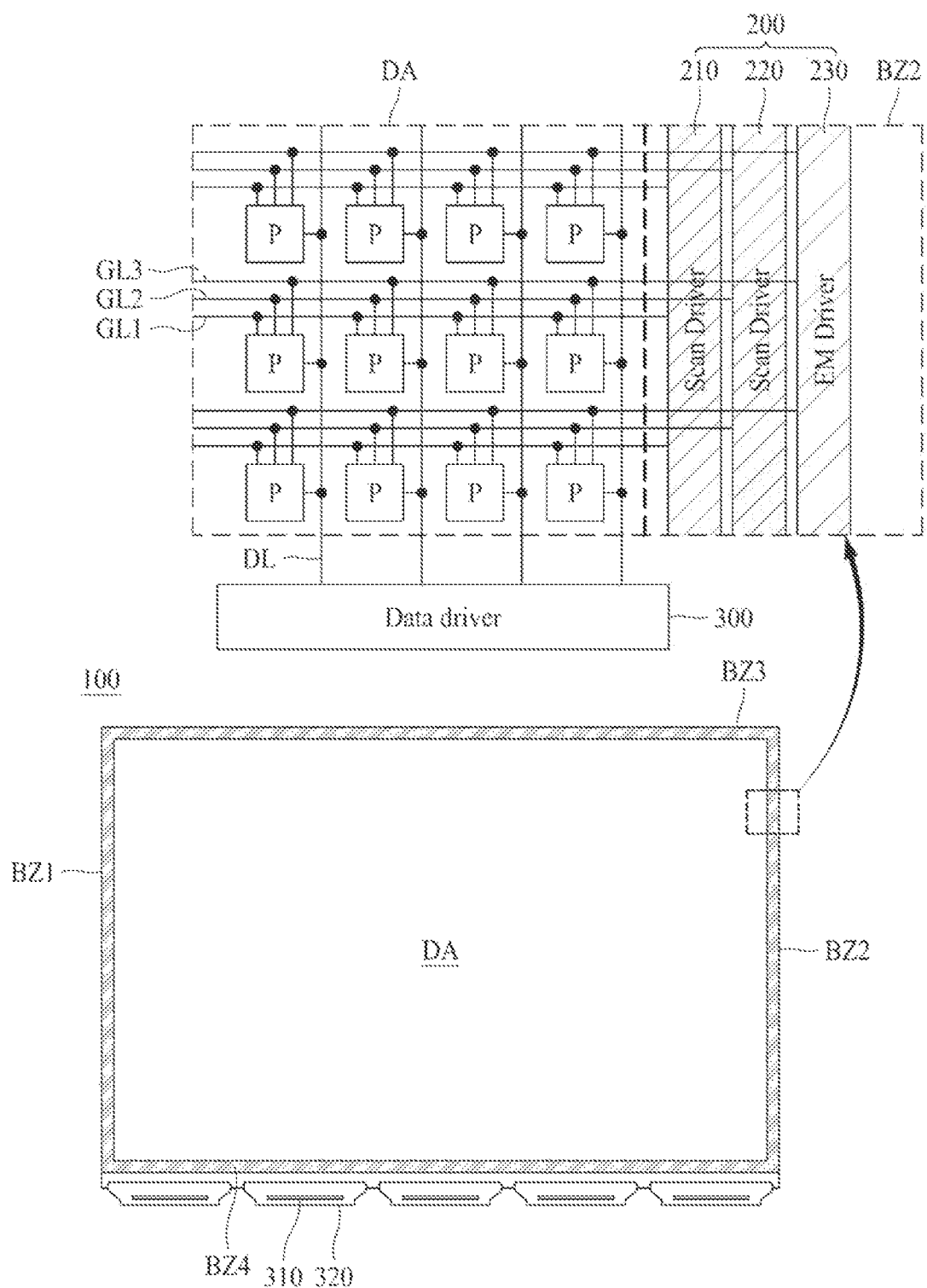
FIG. 1 is a block diagram illustrating a configuration of a display device according to one embodiment of the present disclosure.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have', and 'include' described in the present specification are used, another part can be added unless 'only' is used. The terms of a singular form can include plural forms unless referred to the contrary.

In construing an element, the element is construed as including an error range although there is no explicit description.

In describing a position relationship, for example, when a position relation between two parts is described as "on," "over," "under," and "next," one or more other parts can be disposed between the two parts unless a more limiting term, such as "just" or "direct(ly)" is used.

In describing a time relationship, for example, when the temporal order is described as, for example, "after," "subsequent," "next," and "before," a case which is not continuous can be included unless a more limiting term, such as "just," "immediate(ly)," or "direct(ly)" is used.

It will be understood that, although the terms "first," "second," etc. can be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, the terms "first," "second," "A," "B," "(a)," "(b)," etc., can be used. These terms are intended to identify the corresponding elements from the other elements, and basis, order, or number of the corresponding elements should not be limited by these terms. The expression that an element or a layer is "connected," "coupled," or "adhered" to another element or layer, the element or layer can not only be directly connected or adhered to another element or layer, but also be indirectly connected or adhered to another element or layer with one or more intervening elements or layers "disposed" between the elements or layers, unless otherwise specified.

The term "at least one" should be understood as including any and all combinations of one or more among the associated listed elements. For example, the meaning of "at least one or more of a first element, a second element, and a third element" denotes the combination of all elements proposed from two or more of the first element, the second element, and the third element as well as the first element, the second element, or the third element.

Features of various aspects of the present disclosure can be partially or overall coupled to or combined with each other, and can be variously inter-operated with each other and driven technically as those skilled in the art can sufficiently understand. The aspects of the present disclosure can be carried out independently from each other, or can be carried out together in co-dependent relationship.

Hereinafter, the aspect of the present disclosure will be described with reference to the accompanying drawings. Since a scale of each of elements shown in the accompanying drawings is different from an actual scale for convenience of description, the present disclosure is not limited to the shown scale. Further, all the components of each display device according to all embodiments of the present disclosure are operatively coupled and configured.

FIG. 1 is a block diagram schematically illustrating a configuration of a display device according to one embodiment of the present disclosure.

The display device according to one embodiment of the present disclosure can be an electroluminescent display device including an organic light emitting diode OLED display device, a quantum dot light emitting diode display device, or an inorganic light emitting diode display device.

Referring to FIG. 1, the display device can include a display panel 100, a gate driver 200 embedded in the display panel 100, and a data driver 300.

The display panel 100 displays an image through a display area DA in which a plurality of sub pixels P are arranged in a matrix configuration. The sub pixel P can be any one of red R sub pixel emitting red light, green G sub pixel emitting green light, blue B sub pixel emitting blue light, and white W sub pixel emitting white light. A unit pixel can include at least two sub pixels having different emission colors. Each sub pixel P can include an emission device, and a plurality of TFTs for independently driving the emission device. In the display panel 100, there are a plurality of signal lines including a data line DL, a gate line GL1, GL2, GL3, a power line, and other signal lines, which are connected to each sub pixel P.

The display panel 100 can further include a touch sensor screen disposed in the display area DA and configured to sense a user's touch.

The gate driver 200 can surround the display area DA in the display panel 100 and can be disposed in at least any one bezel area of bezel areas BZ1 to BZ2 located in the periphery of the display panel 100. For example, the gate driver 200 can be disposed in any one of the first and second bezel areas BZ1 and BZ2 facing each other with the display area DA interposed in-between, or can be disposed in both of the first and second bezel areas BZ1 and BZ2. The gate driver 200 can be a gate-in-panel GIP type composed of the thin film transistors TFTs formed in the same process as a TFT array disposed in the display area DA.

The gate driver 200 can include a first scan driver 210 for driving the first gate line GL1 among the first to third gate lines GL GL2, GL3 respectively connected with the sub pixels P of each horizontal line, a second scan driver 220 for driving the second gate line GL2 thereamong, and an emission control driver 230 for driving the third gate line GL3 thereamong.

Each of the first scan driver 210, the second scan driver 220, and the emission control driver 230 can be operated by receiving a gate control signal supplied from a timing controller through a level shifter.

The first scan driver 210 can include a plurality of first scan stages for supplying a first scan signal to the plurality of first gate lines GL1, individually. The first scan signal can control a first switching TFT of each of the plurality of sub pixels P connected to the first gate line GL1.

The second scan driver 220 can include a plurality of second scan stages for supplying a second scan signal to the plurality of second gate lines GL2, individually. The second scan signal can control a second switching TFT of each of the plurality of sub pixels P connected to the second gate line GL2.

The emission control driver 230 can include a plurality of emission control stages for supplying an emission control signal to the plurality of third gate lines GL3, individually. The emission control signal can control an emission control TFT of each of the plurality of sub pixels P connected to the third gate line GL3.

The data driver 300 can convert digital data received from the timing controller into an analog data signal and can supply each data voltage signal to each data line DL of the display panel 100. The data driver 300 can convert the digital data into the analog data voltage signal using gray-scale voltages obtained by subdividing a plurality of reference gamma voltages supplied from a gamma voltage generator.

The data driver 300 can include a plurality of data drive integrated circuits ICs 310 that divide and drive the plurality of data lines DL disposed in the display panel 100. Each of the plurality of data drive ICs 310 can be individually mounted on each circuit film 320 such as a Chip On Film COF type. The plurality of COFs 320 on which the data drive IC 310 is mounted can be bonded to the bezel area BZ4 of the display panel 100 through the use of anisotropic conductive film ACF.

At least one of an amorphous silicon TFT using an amorphous silicon semiconductor layer, a polysilicon TFT using a polysilicon semiconductor layer, and an oxide TFT using a metal oxide semiconductor layer can be applied to the plurality of TFTs disposed in the display area DA of the display panel 100 and the bezel areas BZ1 to BZ2 including the gate driver 200.

For example, an oxide TFT, which has a higher mobility than that of an amorphous silicon TFT and facilitates a low temperature process in comparison to a polysilicon TFT, and also is capable of being applied to a large size, can be applied to the display panel 100, and an oxide TFT of coplanar type having good TFT characteristics can be applied to the display panel 100. The oxide TFT can further include a light shielding layer disposed below the oxide semiconductor layer with a buffer layer interposed therebetween to prevent light from flowing into the oxide semiconductor layer.

The coplanar oxide TFT has a large on-current (Ion) owing to a thin gate insulating layer having a small thickness, and has a steep slope of a gate voltage to a current characteristic, whereby 'S-factor' corresponding to the inverse of the slope is small, and a parasitic capacitance is small. Thus, if the coplanar oxide TFT is applied to the gate driver 200, it has advantages of enabling high-speed driving, and reducing the size of the TFT. The 'S-factor' is the current-voltage characteristic of the TFT, wherein it means the magnitude of gate voltage required to increase a drain current by ten times when a gate voltage equal to or less than a threshold voltage is applied.

The gate driver 200 according to one embodiment of the present disclosure can use an N-type coplanar oxide TFT, and an off-voltage applied to a gate electrode can be the same as a voltage applied to a source electrode when the specific TFT is turned-off. In this case, when the specific TFT has a negative threshold voltage (Vth<0), a leakage current can increase as the difference between the gate-source voltage Vgs and the threshold voltage Vth is greater than 0V (Vgs−Vth>0V).

In order to prevent this, the gate driver 200 according to one embodiment of the present disclosure applies a back gate bias voltage lower than the source electrode to a light shielding layer of the specific TFT, thereby shifting the negative threshold voltage to a positive side.

For example, the emission control driver 230 of the gate driver 200 includes a back bias circuit connected to a Q node and a QB node for controlling an output buffer in each of the plurality of emission control stages and configured to apply a back gate bias voltage, which is lower than the source voltage, to the light shielding layer of the specific TFT having a relatively large gravity of consumption current, thereby reducing leakage current and power consumption. A detailed description thereof will be described later with reference to FIGS. 7 to 14B.

Figure 2:
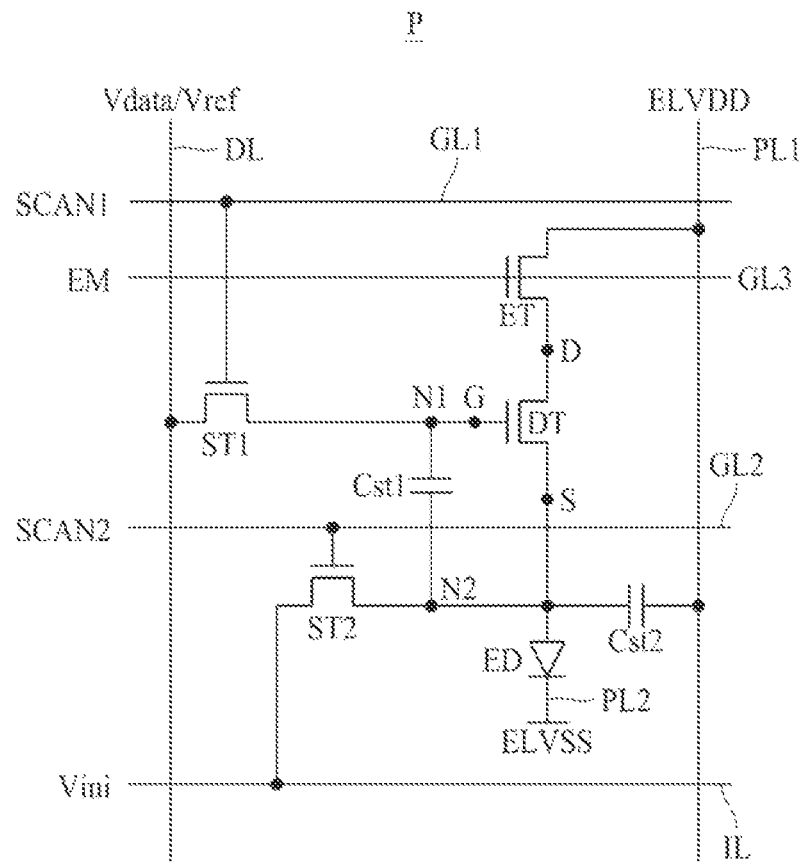
FIG. 2 is an equivalent circuit diagram illustrating a pixel circuit according to one embodiment of the present disclosure.
Figure 3:
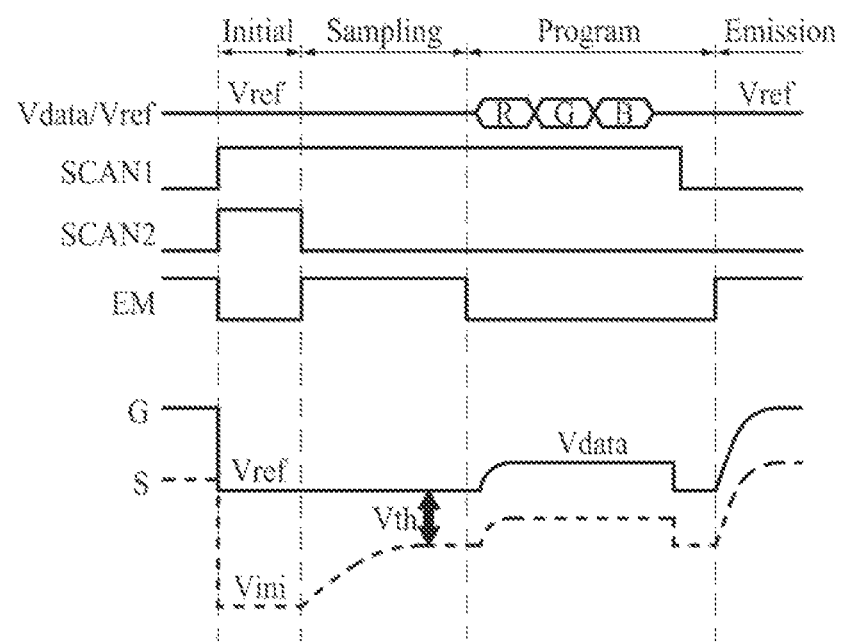
FIG. 3 is a driving waveform diagram of the pixel circuit shown in FIG. 2.

FIG. 2 is an equivalent circuit diagram illustrating a pixel circuit according to one embodiment of the present disclosure, and FIG. 3 is a driving waveform diagram of the pixel circuit shown in FIG. 2.

Referring to FIG. 2, the pixel circuit of each sub pixel P can be provided in a 4T2C structure including a driving TFT DT for supplying a current to a light emitting device ED, a switching TFT ST1, an initialization TFT ST2, an emission control TFT ET, and a storage capacitor Cst1 and Cst2.

Each sub pixel P can be connected to the first to third gate lines GL1, GL2, GL3, the data line DL, first and second power lines PL1 and PL2, and an initialization voltage line IL disposed on the display panel 100.

The first scan driver 210 can supply the first scan signal SCAN1 to the first gate line GL1. The second scan driver 220 can supply the second scan signal SCAN2 to the second gate line GL2. The emission control driver 230 can supply the emission control signal EM to the third gate line GL3. The data driver 300 can supply a data voltage Vdata to the data line DL. A power circuit can supply a high potential power supply voltage ELVDD to the first power line PL1, a low potential power supply voltage ELVSS to the second power line PL2, and an initialization voltage Vini to the initialization voltage line IL.

Referring to FIG. 3, each sub pixel P can be driven to include an initial period, a sampling period, a program period, and an emission period for each frame.

Referring to FIGS. 2 and 3, the switching TFT ST1 can be controlled by the first gate line GL1, and can connect the data line DL to a first node N1 connected to a gate electrode G of the driving TFT DT. During the initialization period, the sampling period, and the program period, the switching TFT ST1 is turned-on by the high potential power supply voltage of the first scan signal SCAN1 of the first gate line GL1 to sequentially supply a reference voltage Vref and the data voltage Vdata supplied through the data line DL1 to the first node N1.

The initialization TFT ST2 can be controlled by the second gate line GL2 and can connect the initialization voltage line IL to a second node N2 commonly connected with a source electrode S of the driving TFT DT and an anode of the light emitting device ED. During the initialization period, the initialization TFT ST2 is turned-on by the high potential power supply voltage of the second scan signal SCAN2 of the second gate line GL2 to supply the initialization voltage Vini of the initialization voltage line IL to the second node N2.

The emission control TFT ET can be controlled by the third gate line GL3, and can connect the first power line PL1 to a drain electrode D of the driving TFT DT. During the sampling period and the emission period, the emission control TFT ET can be turned-on by the high potential power supply voltage of the emission control signal EM of the third gate line GL3, and can supply the high potential power supply voltage ELVDD of the first power line PL1 to the drain electrode D of the driving TFT DT.

The first storage capacitor Cst1 can be connected between the first node N1 and the second node N2 to charge the data voltage Vdata+Vth compensated by a threshold voltage Vth of the driving TFT DT.

The second storage capacitor Cst2 is connected between the first power line PL1 and the second node N2 commonly connected with the source electrode S of the driving TFT DT and the anode of the light emitting device ED, to thereby stably maintain the potential of the second node N2 during the emission period.

The driving TFT DT can control an emission intensity of the light emitting device LED by controlling a current Ids flowing to the light emitting device ED according to the driving voltage Vdata+Vth charged in the first storage capacitor Cst1.

The light emitting device ED can include an anode connected to the source electrode S of the driving TFT DT, a cathode connected to the second power line PL2 for supplying the low potential power supply voltage ELVSS, and an organic light emitting layer between the anode and the cathode. The light emitting device ED can generate light of brightness proportional to a current value of a driving current supplied from the driving TFT DT.

Referring to FIG. 3, during the initialization period, the first node N1 is initialized to the reference voltage Vref through the data line DL and the switching TFT ST1, and the second node N2 is initialized to the initialization voltage Vini through the initialization voltage line IL and the initialization TFT ST2. Also, the high potential power supply voltage ELVDD can be supplied to the drain electrode D of the driving TFT DT through the first power line PL1 and the emission control TFT ET.

During the sampling period, the voltage of the source electrode S of the driving TFT DT can be increased until a gate-source voltage Vgs of the driving TFT DT becomes the threshold voltage Vth by a source follow operation of the driving TFT DT, whereby the first storage capacitor Cst1 can charge the threshold voltage Vth of the driving TFT DT.

During the program period, the data voltage Vdata is supplied to the first node N1 so that the first storage capacitor Cst1 can charge the data voltage Vdata+Vth compensated by the threshold voltage Vth of the driving TFT DT. Accordingly, it is possible to compensate the characteristic deviation by the threshold voltage of the driving TFT DT between the sub pixels P for the emission period.

During the emission period, the driving TFT DT can drive the light emitting device ED according to the driving voltage Vdata+Vth charged in the first storage capacitor Cst1, to thereby control the emission intensity.

Figure 4:
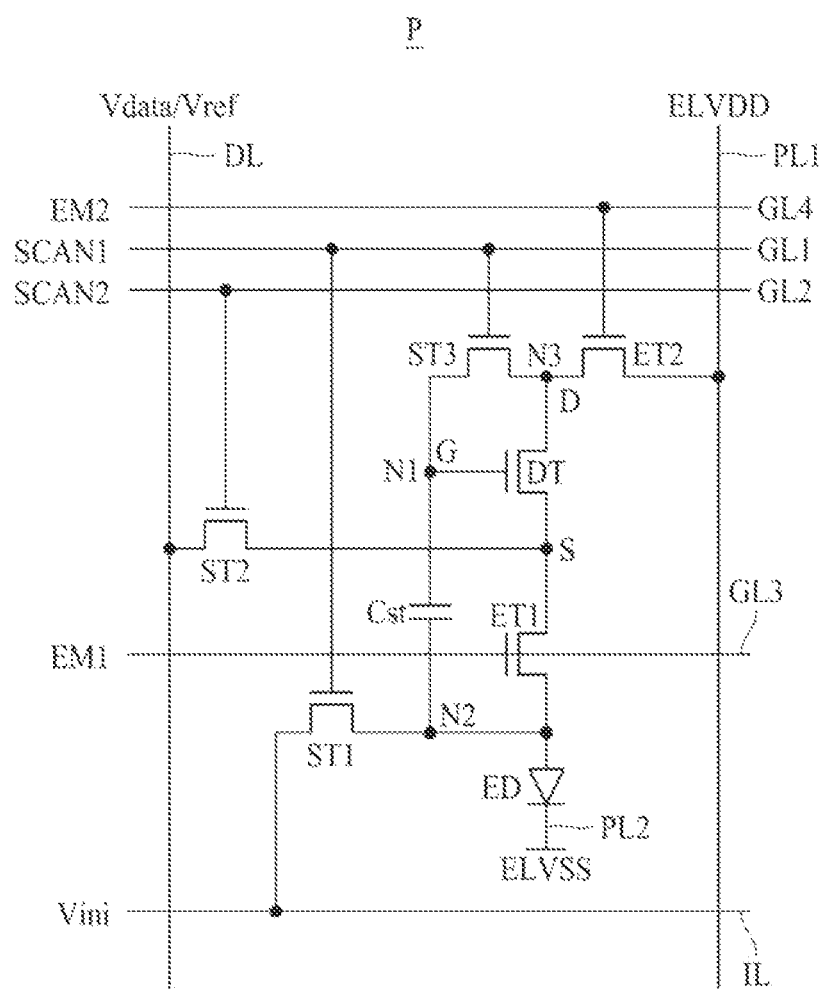
FIG. 4 is an equivalent circuit diagram illustrating a pixel circuit according to one embodiment of the present disclosure.
Figure 5:
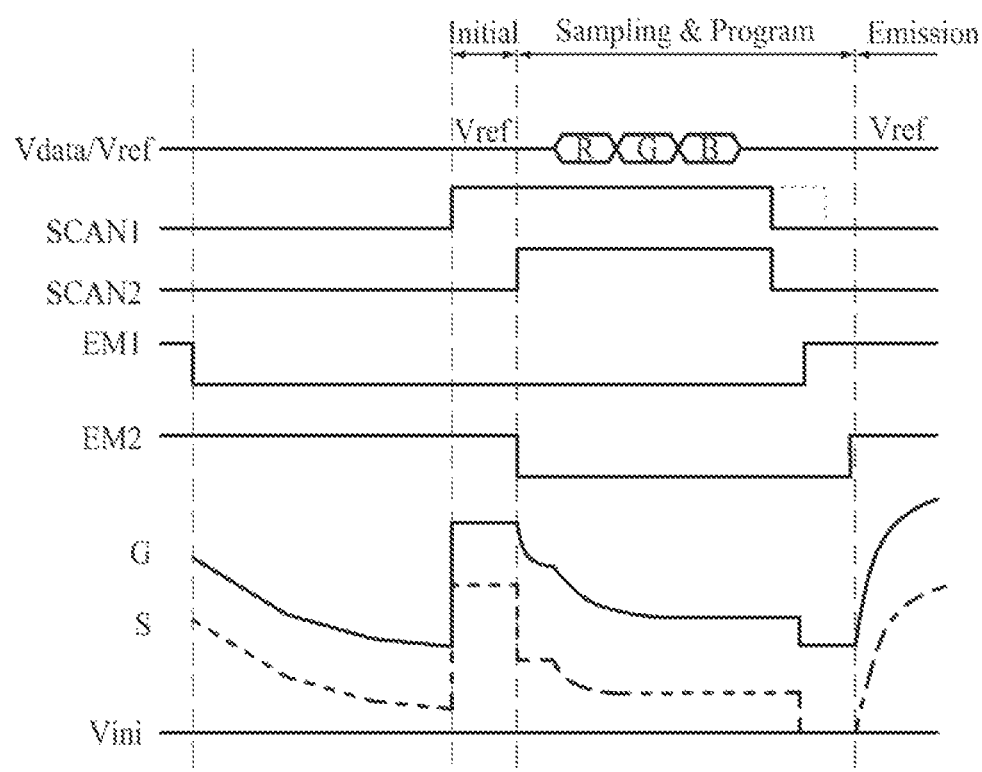
FIG. 5 is a driving waveform diagram of the pixel circuit shown in FIG. 4.

FIG. 4 is an equivalent circuit diagram illustrating a pixel circuit according to one embodiment of the present disclosure, and FIG. 5 is a driving waveform diagram of the pixel circuit shown in FIG. 4.

Referring to FIG. 4, the pixel circuit of each sub pixel P can be provided in a 6T1C structure including a driving TFT DT for supplying a current to a light emitting device ED, an initialization TFT ST1, a switching TFT ST2, a compensation TFT ST3, a first emission control TFT ET1, a second emission control TFT ET2, and a storage capacitor Cst.

Each sub pixel P can be connected to the first to fourth gate lines GL1, GL2, GL3, GL4, the data line DL, the first and second power lines PL1 and PL2, and the initialization voltage line IL disposed on the display panel 100.

The first scan driver 210 can supply the first scan signal SCAN1 to the first gate line GL1. The second scan driver 220 can supply the second scan signal SCAN2 to the second gate line GL2. The emission control driver 230 can supply a first emission control signal EM1 to the third gate line GL3 and can supply a second emission control signal EM2 to the fourth gate line GL4. Meanwhile, the emission control driver 230 can include a first emission control driver for supplying the first emission control signal EM1 to the third gate line GL3, and a second emission control driver for supplying the second emission control signal EM2 to the fourth gate line GL4. The data driver 300 can supply a data voltage Vdata to the data line DL. A power circuit can supply a high potential power supply voltage ELVDD to the first power line PL1, a low potential power supply voltage ELVSS to the second power line PL2, and an initialization voltage Vini to the initialization voltage line IL.

Referring to FIG. 5, each sub pixel P can be driven to include an initialization period, a sampling and program period, and an emission period for each frame.

Referring to FIGS. 4 and 5, the initialization TFT ST1 can be controlled by the first gate line GL1, and can connect the initialization voltage line IL to a second node N2 connected with an anode of the light emitting device ED. During the initialization period and the sampling and program period, the initialization TFT ST1 is turned-on by the high potential power supply voltage of the first scan signal SCAN1 of the first gate line GL1, to thereby supply the initialization voltage Vini of the initialization voltage line IL to the second node N2.

The switching TFT ST2 can be controlled by the second gate line GL 2, and can connect the data line DL with a source electrode S of the driving TFT DT. During the sampling and program period, the switching TFT ST2 can be turned-on by the high potential power supply voltage of the second scan signal SCAN2 of the second gate line GL2 to sequentially supply a reference voltage Vref and the data voltage Vdata supplied through the data line DL to the source electrode S of the driving TFT DT.

The compensation TFT ST3 can be controlled by the first gate line GL1 and can connect a first node N1 connected to a gate electrode G of the driving TFT DT and a third node N3 connected to a drain electrode D of the driving TFT DT with each other. During the initialization period and the sampling and program period, the compensation TFT ST3 is turned-on by the high potential power supply voltage of the first scan signal SCAN1 of the first gate line GL1, so that it is possible to connect the gate electrode G and the drain electrode D of the driving TFT DT with each other, to thereby realize the driving TFT DT connected in a diode structure.

The first emission control TFT ET1 can be controlled by the third gate line GL3, and can connect the source electrode S of the driving TFT DT and the anode of the light emitting device ED with each other. During the emission period, the first emission control TFT ET1 is turned-on by the high potential power supply voltage of the first emission control signal EM1 of the third gate line GL3 to connect the driving TFT DT and the light emitting device ED with each other.

The second emission control TFT ET2 can be controlled by the fourth gate line GL4, and can connect the first power line PL1 and the drain electrode D of the driving TFT DT. During the initialization period and the emission period, the second emission control TFT ET2 is turned-on by the high potential power supply voltage of the second emission control signal EM2 of the fourth gate line GL4 to supply the high potential power supply voltage ELVDD of the first power line PL1 to the drain electrode D of the driving TFT DT.

The storage capacitor Cst can be connected between the first node N1 and the second node N2 to charge the data voltage Vdata+Vth compensated by the threshold voltage Vth of the driving TFT DT with the driving voltage.

The driving TFT DT can control an emission intensity of the light emitting device ED by controlling a current Ids flowing to the light emitting device ED according to the driving voltage charged in the storage capacitor Cst.

The light emitting device ED can include an anode connected to the source electrode S of the driving TFT DT through the first emission control TFT ET1, a cathode connected to the second power line PL2 for supplying the low potential power supply voltage ELVSS, and an organic light emitting layer between the anode and the cathode. The light emitting device ED can generate light of brightness proportional to a current value of a driving current supplied through the first emission control TFT ET1 from the driving TFT DT.

Referring to FIG. 5, during the initialization period, the gate electrode G and the source electrode S of the driving TFT DT are initialized to the high potential power supply voltage ELVDD of the first power line PL1 through the second emission control TFT ET12 and the diode-connected driving TFT DT, and the anode of the light emitting device ED can be initialized to the initialization voltage Vini of the initialization voltage line IL through the initialization TFT ST1.

During the sampling and program period, the data voltage Vdata is supplied to the source electrode S of the driving TFT DT through the switching TFT ST2, and the voltage of the gate electrode G can be charged with a target voltage ELVDD-Vdata+Vth compensated by the threshold voltage Vth of the driving TFT DT through the diode-connected driving TFT DT. Accordingly, the characteristic deviation of the driving TFT DT between the subpixels can be compensated.

During a particular period between the sampling and program period and the emission period, the storage capacitor Cst can charge the target voltage ELVDD-Vdata+Vth.

During the emission period, the driving TFT DT can drive the light emitting device ED according to the driving voltage ELVDD−Vdata+Vth charged in the storage capacitor Cst, to thereby control the emission intensity.

Figure 6:
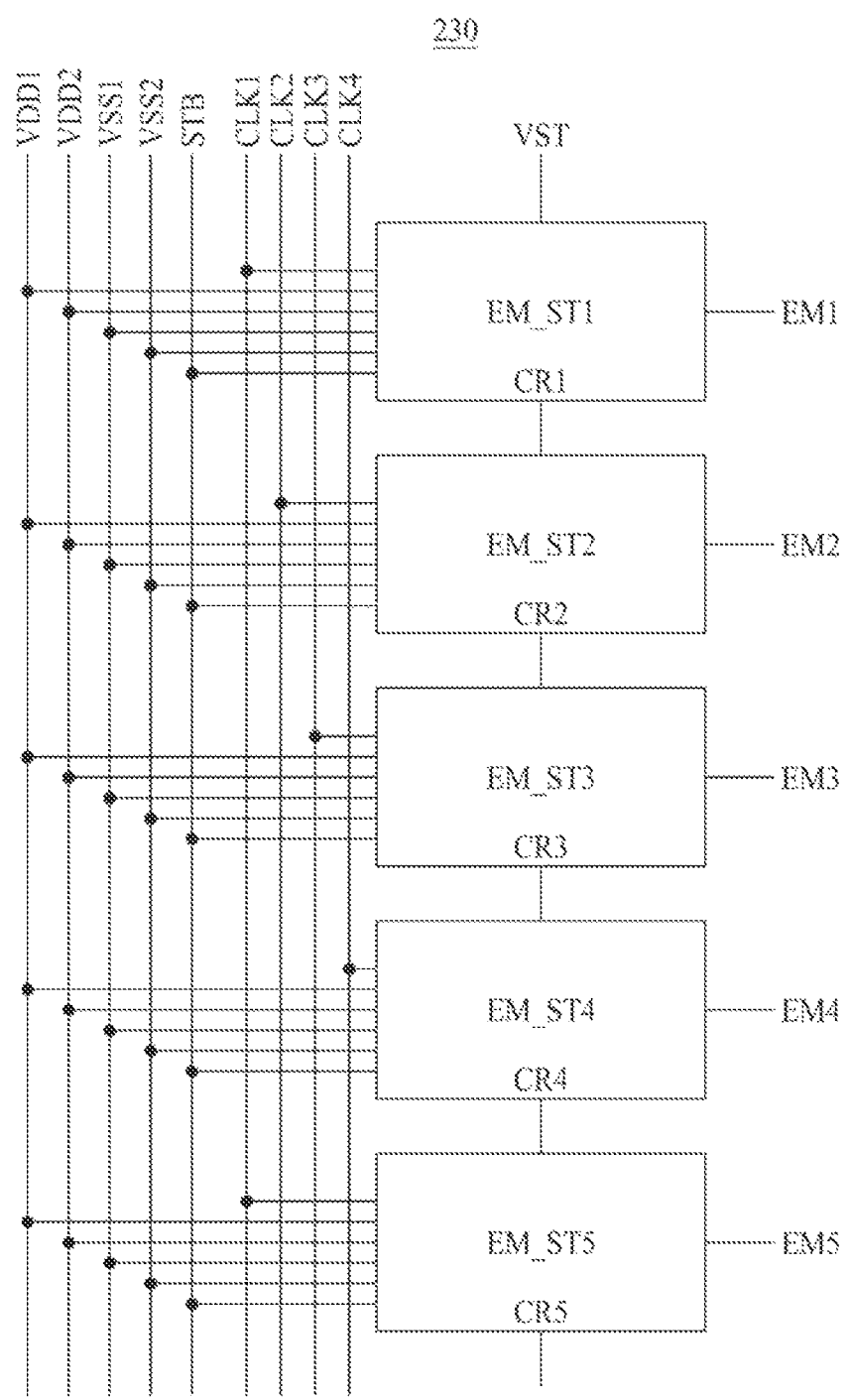
FIG. 6 is a block diagram illustrating a configuration of some stages of an emission control driver according to one embodiment of the present disclosure.

FIG. 6 is a block diagram of the emission control driver 230 according to one embodiment of the present disclosure.

Referring to FIG. 6, the emission control driver 230 according to one embodiment of the present disclosure can include a plurality of emission control stages EM_ST1~EM_ST5 for sequentially outputting the plurality of emission control signals EM1 EM5. In FIG. 6, only five emission control stages EM_ST1~EM_ST5 are shown for convenience of explanation.

The plurality of emission control stages EM_ST1~EM_ST5 can be supplied with any one clock signal among four phase clock signals CLK1~CLK4 having different phases. The plurality of emission control stages EM_ST1~EM_ST5 can be commonly supplied with first and second high potential power supply voltages VDD1 and VDD2 and first and second low potential power supply voltages VSS1 and VSS2.

Among the plurality of emission control stages EM_ST1~EM_ST5, the first emission control stage EM_ST1 can be supplied with a start pulse VST as a charge/discharge signal, and the other emission control stages EM_ST2~EM_ST5 excluding the first emission control stage EM_ST1 can be supplied with a carry signal CR1~CR4 of the preceding stage as a charge/discharge signal. For example, the carry signal CR1~CR5 output from each of the plurality of emission control stages EM_ST1~EM_ST5 can be supplied as the charge/discharge signal of the next stage.

Figure 7:
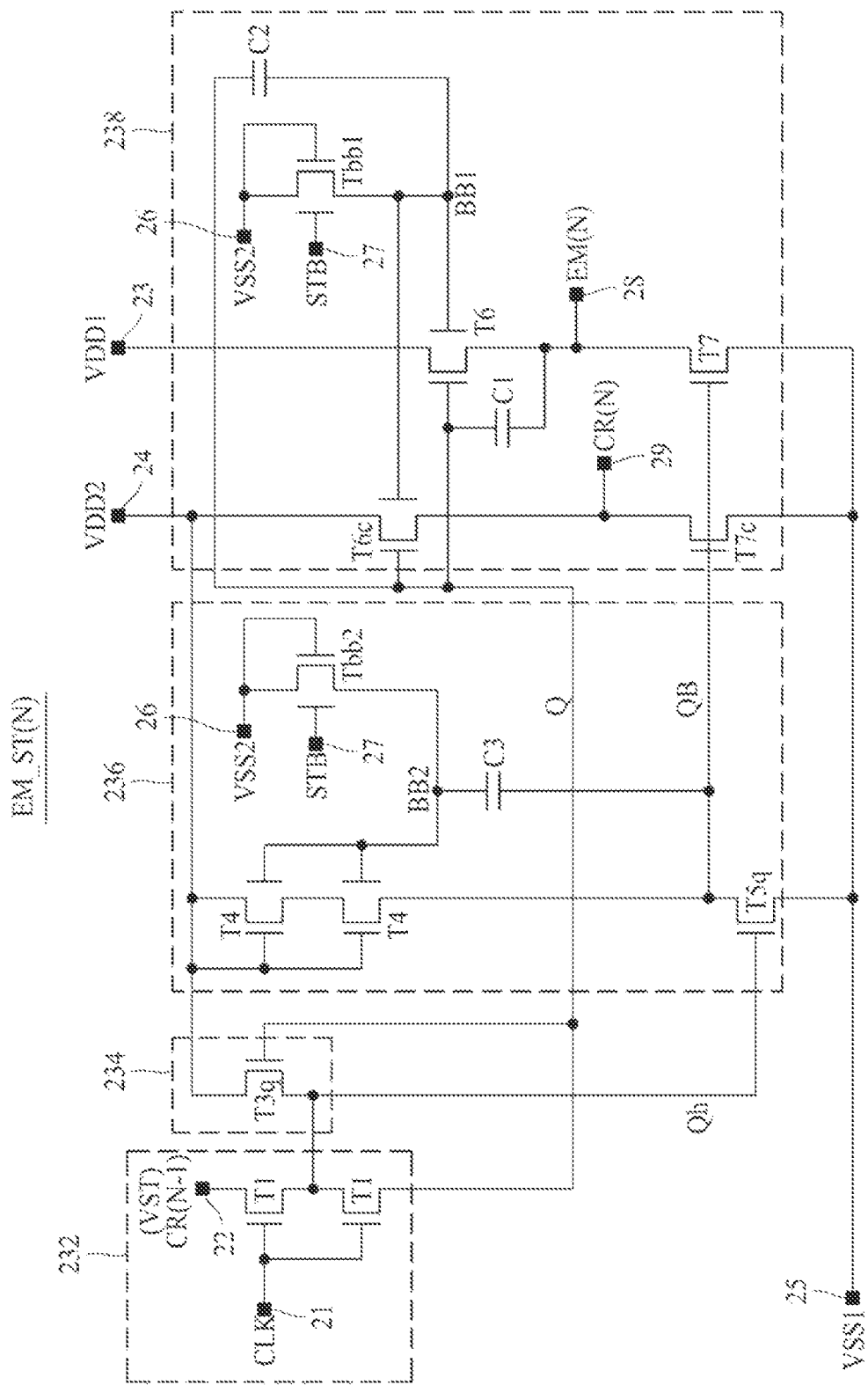
FIG. 7 is an equivalent circuit diagram illustrating a circuit configuration of an emission control stage in the emission control driver according to one embodiment of the present disclosure.
Figure 8:
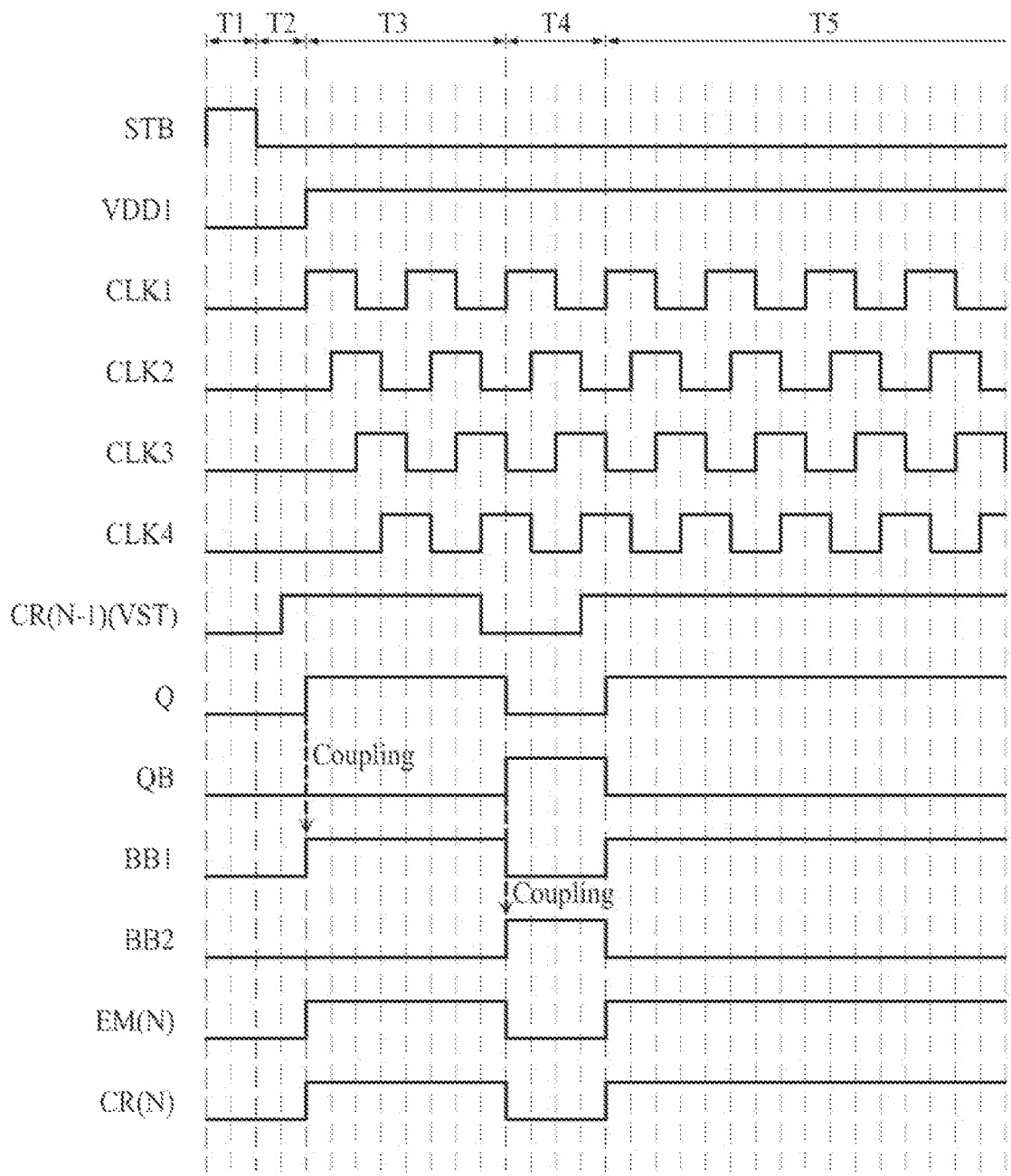
FIG. 8 is a driving waveform diagram of the emission control stage shown in FIG. 7.

FIG. 7 is an equivalent circuit diagram illustrating a configuration of each emission control stage in the emission control driver according to one embodiment of the present disclosure, and FIG. 8 is a driving waveform diagram of the emission control stage shown in FIG. 7.

Referring to FIG. 7, each emission control stages EM_ST (N) can be connected to an input line 22 to which the start signal VST or the carry signal CR(N-1) ('N' is an integer above 2) of the preceding stage is supplied as the charge/discharge signal, a clock line 21 to which any one clock signal CLK among a plurality of clock signals CLK1~CLK4 is supplied, a first power line 23 to which the first high potential power supply voltage VDD1 is supplied, a second power line 24 to which the second high potential power supply voltage VDD2 is supplied, a third power line 25 to which the first low potential power supply voltage VSS1 is supplied, a fourth power line 26 to which the second low potential power supply voltage VSS2 is supplied, a stabilization line 27 to which a stabilization signal STB is supplied, an output line 28 for outputting the emission control signal EM(N), and a carry output line 29 for outputting the carry signal CR(N).

The high potential power supply voltages VDD1 and VDD2 can be defined as a gate high voltage or a gate-on voltage. The first high potential power supply voltage VDD1 can be the same as or higher than the second high potential power supply voltage VDD2.

The low potential power supply voltage VSS1 and VSS2 can be defined as a gate low voltage or a gate-off voltage. The second low potential power supply voltage VSS2 can be lower than the first low potential power supply voltage VSS1.

The stabilization signal STB corresponds to a voltage for initializing the entire node of the scan driver 210 and 220 for each vertical blank period of each frame. For example, as shown in FIG. 8, the stabilization signal STB can have an on (high) level in a vertical blank period T1 of each frame and an off (low) level during an active period T2~T5. The on-level of the stabilization signal STB can be equal to the high potential power supply voltage VDD1 and VDD2, and the off-level of the stabilization signal STB can be the same as the second low potential power supply voltage VSS2.

The clock signal CLK can be any one of the plurality of clock signals having different phases, for example, four-phase clock signals CLK1 to CLK4 whose phases are sequentially shifted, as shown in FIG. 8. The on (high) level of the clock signal CLK1~CLK4 is equal to the high potential power supply voltage VDD1 and VDD2, and the off (low) level of the clock signal CLK1 CLK4 can be equal to the first low potential power supply voltage VSS1.

Each emission control stage EM_ST(N) ('N' is a positive integer) can include a charge/discharge part 232, a leakage prevention part 234, an inverter 236, and an output buffer 238. The charge/discharge part 232, the leakage prevention part 234, and the inverter 236 can be defined as a control part for controlling the Q node (first control node) and the QB node (second control node) of the output buffer 238.

The charge/discharge part 232 can include a pair of charge/discharge transistors T1 for charging and discharging the Q node. The leakage prevention part 234 can include a charge transistor T3q for charging a Qh node (third control node) and an intermediate node between the pair of charge/discharge transistors T1. The inverter 236 can include a pair of charge transistors T4 for charging the QB node and a discharge transistor T5q for discharging the QB node. The output buffer 238 can include a first pull-up transistor T6 and a first pull-down transistor T7 for charging and discharging the output line 28 outputting the emission control signal EM(N), and a second pull-up transistor T6c and a second pull-down transistor T7c for charging and discharging the carry signal CR(N).

The output buffer 238 can further include a back bias circuit including a back bias node BB1 capacitance-coupled to the Q node through the capacitor C2 and connected to a light shielding layer 112A (see FIG. 9) of the pull-up transistors T6 and T6c, and a back bias transistor Tbb1 connected to the back bias node BB1. The back bias circuit can be separately disposed from the output buffer 238.

The inverter 236 can further include a back bias circuit including a back bias node BB2 capacitance-coupled to the QB node through the capacitor C3 and connected to a light shielding layer 112A of the charge transistor T4, and a back bias transistor Tbb2 connected to the back bias node BB2. The back bias circuit can be separately disposed from the inverter 236.

Figure 9:
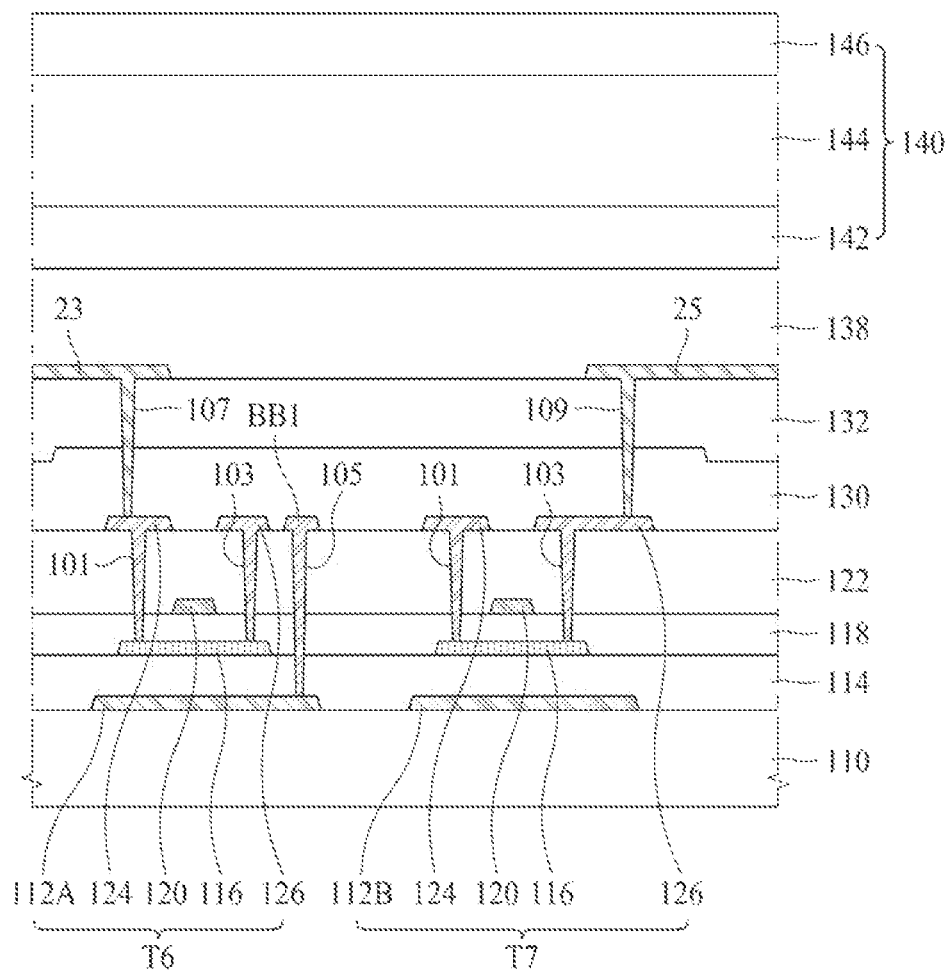
FIG. 9 is a cross sectional view illustrating a structure of some TFTs of the emission control driver according to one embodiment of the present disclosure.

Transistors T1, T3$q$, T4, T5$q$, T6$c$, T7$c$, T6, T7, Tbb1, and Tbb2 constituting each emission control stage EM_ST(N) can be a coplanar type oxide TFT including the light shielding layer 112A and 112B shown in FIG. 9.

FIG. 9 illustrates a simplified cross-sectional structure of some TFTs of the emission control driver, for example, the first pull-up transistor T6 and the first pull-down transistor T7 according to one embodiment of the present disclosure.

The first pull-up transistor T6 and the first pull-down transistor T7 can include a light shielding layer 112A and 112B on a substrate 110, a buffer film 114 covering the light shielding layer 112A and 112B, a semiconductor layer 116 disposed on the buffer film 114, a gate insulating film 118 covering the semiconductor layer 116, a gate electrode 120 disposed on the gate insulating film 118, an insulating interlayer 122 covering the gate electrode 120, and a source electrode 126 and a drain electrode 124 disposed on the insulating interlayer 122 and connected to conductive regions of the semiconductor layer 116 through contact holes 103 and 101, respectively.

The remaining transistors T1, T3$q$, T4, T5$q$, T6$c$, T7$c$, Tbb1, and Tbb2 of the emission control driver can have a similar structure to the first pull-up transistor T6 and the first pull-down transistor T7.

The emission control driver 230 can further include an inorganic insulating film 130 and an organic insulating film 132 deposited to cover the source electrode 126 and the drain electrode 124, a power line 23 and 25 disposed on the organic insulating film 132, an organic insulating film 138 covering the power line 23 and 25, and an encapsulation layer 140 deposited on the organic insulating film 138 and configured to include an inorganic insulating film 142, an organic insulating film 144 and an inorganic insulating film 146. The first power line 23 can be connected to the drain electrode 124 of the first pull-up transistor T6 through the contact hole 107, and the third power line 25 can be connected to the source electrode 126 of the first pull-down transistor T7 through the contact hole 109. Other power lines 24, 26, 27 and clock line 21 can be disposed in the same layer as the power lines 23 and 25.

The semiconductor layer 116 can include a channel region overlapping the gate electrode 120 with the gate insulating film 118 interposed therebetween, and a conductor region disposed on both sides of the channel region and electrically ohmic-connected to the source electrode 126 and the drain electrode 124, respectively. The semiconductor layer 116 can include an oxide semiconductor material. For example, the semiconductor layer 116 can include at least one of IZO(InZnO)-based, IGO(InGaO)-based, ITO(InSnO)-based, IGZO(InGaZnO)-based, IGZTO(InGaZnSnO)-based, GZTO(GaZnSnO)-based, GZO(GaZnO)-based and ITZO(InSnZnO)-based materials.

The light shielding layers 112A and 112B can be made of an opaque metal and absorb external light or internal light, thereby preventing light from flowing into the oxide semiconductor layer 116.

The light shielding layer 112A of the first pull-up transistor T6 can be connected to the back bias node BB1 through the contact hole 105. The pair of charge transistors T4 of the inverter 236 and the second pull-up transistor T6$c$ can have a structure of the light shielding layer 112A connected to the back bias node BB1 and BB2 similarly to the first pull-up transistor T6.

The light shielding layer 112B of the other transistors T1, T3$q$, T5$q$, and T7$c$ including the first pull-down transistor T7 can be floated, or can be connected to the gate electrode 120 or the source electrode 126.

The light shielding layer 112B of the back bias transistor Tbb1, Tbb2 can serve as a back gate electrode supplied with the stabilization signal STB, and the gate electrode 120 can be connected to the drain electrode 124.

Referring to FIG. 7, the charge/discharge part 232 can charge or discharge the Q node with the charge/discharge signal VST or CR(N−1) supplied to the input terminal 22 in response to the clock signal CLK supplied to the clock line 21. The charge/discharge part 232 can include a pair of charge/discharge transistors T1 provided with gate electrodes connected to the clock line 21 in common and connected in series between the input line 22 and the Q node. When the clock signal CLK is activated to the on-level, the charge/discharge transistor T1 can charge the Q node to the start signal VST or the on-level of the carry output CR(N−1) of the preceding stage, and can discharge the Q node to the start signal VST or the off-level of the carry output CR(N−1) of the preceding stage.

The leakage prevention part 234 can include a charge transistor T3$q$ for supplying the second high potential power supply voltage VDD2 to the Qh node and the intermediate node between the pair of charge/discharge transistors T1 in response to the control of the Q node. The charge transistor T3$q$ has a gate electrode connected to the Q node, a drain electrode connected to the second power line 24, and a source electrode connected to the Qh node and the intermediate node between the pair of charge/discharge transistors T1.

The charge transistor T3$q$ turned-on by the on-level of the Q node can suppress a leakage current when the charge/discharge transistor T1 is turned-off by supplying the second high potential power supply voltage VDD2 to the intermediate node between the pair of charge/discharge transistors T1, and can control the discharge transistor T5$q$ by supplying the second high potential power supply voltage VDD2 to the discharge transistor T5$q$ of the inverter 236 through the Qh node.

The inverter 236 can control the QB node to be opposite to the Q node. The inverter 236 can include a pair of charge transistors T4 connected in a diode structure between the second power line 24 and the QB node, and a discharge transistor T5$q$ connected between the QB node and the third power line 25 and controlled by the Qh node.

A pair of charge transistors T4 of the diode structure can maintain a turn-on state. When the Q node is at the off-level, the discharge transistor T5$q$ is turned-off, and the QB node is charged and activated to the on-level by the second high potential power supply voltage VDD2 supplied through the pair of charge transistors T4. In contrast, when the Q node is at the on-level, the discharge transistor T5$q$ is turned-on, and the QB node can be discharged to the first low potential power supply voltage VSS1, and can be inactivated.

The output buffer 238 can include the first pull-up transistor T6 for outputting the first high potential power supply voltage VDD1 supplied to the first power line 23 to the output line 28 in response to the control of the Q node, and the second pull-up transistor T6$c$ for outputting the second high potential power supply voltage VDD2 supplied to the second power line 24 to the carry output line 29 in response to the control of the Q node. The output buffer 238 can include the first and second pull-down transistors T7 and T7c for outputting the first low potential power supply voltage VSS1 of the third power line 25 to the output line 28 and the carry output line 29 in response to the control of the QB node. The output buffer 238 can further include a first capacitor C1 connected between the source electrode (output line 28) and the gate electrode (Q node) of the first pull-up transistor T6 so as to elevate the on-level of the Q node.

Referring to FIGS. 7 and 8, the first and second pull-up transistors T6 and T6c can be turned-on during periods T3 and T5 when the Q node is activated to the on-level by the charge/discharge part 232, and can be turned-off during periods T1, T2, and T4 when the Q node is deactivated to the off-level. During the activation period T3 and T5 of the Q node, the turned-on first pull-up transistor T6 can output the first high potential power supply voltage VDD1 of the first power line 23 to enable the on-level of the emission control signal EM(N) through the output line 28, and the turned-on second pull-up transistor T6c can output the second high potential power supply voltage VDD2 of the second power line 24 to enable the on-level of the carry output CR(N) through the carry output line 29.

The first and second pull-down transistors T7 and T7c can be turned-on during the period T4 when the QB node is activated to the on-level, and can be turned-off during the remaining periods T1~T3 and T5 when the QB node is deactivated to the off-level. During the activated period T4 of the QB node, the turned-on first pull-down transistor T7 can output the first low potential power supply voltage VSS1 of the third power supply line 25 to enable the off-level of the emission control signal EM(N) through the output line 28, and the turned-on second pull-down transistor T7c can output the first low potential power supply voltage VSS1 of the third power supply line 25 to enable the off-level of the carry output CR(N) through the carry output line 29.

The back bias transistors Tbb1 and Tbb2 of the output buffer 238 and the inverter 236 can shift a threshold voltage of the specific transistors T6, T6c, and T4 in a positive direction by applying a back gate bias voltage VSS2, which is lower than a corresponding source voltage, to the light shielding layer 112A of the specific transistors T6, T6c, and T4 through the back bias node BB1 and BB2.

According as the back bias transistor Tbb1 and Tbb2 is turned-on during the period T1 when the stabilization signal STB is at the on-level, the back bias node BB1 and BB2 can be initialized to the second low potential power supply voltage VSS2. Also, according as the back bias transistor Tbb1 and Tbb2 is turned-off during the period T2~T5 when the stabilization signal STB is at the off-level, the back bias node BB1 and BB2 can be floated. The floated back bias node BB1 and BB2 can vary depending on the voltage of the coupled Q node or QB node.

Figure 10A:
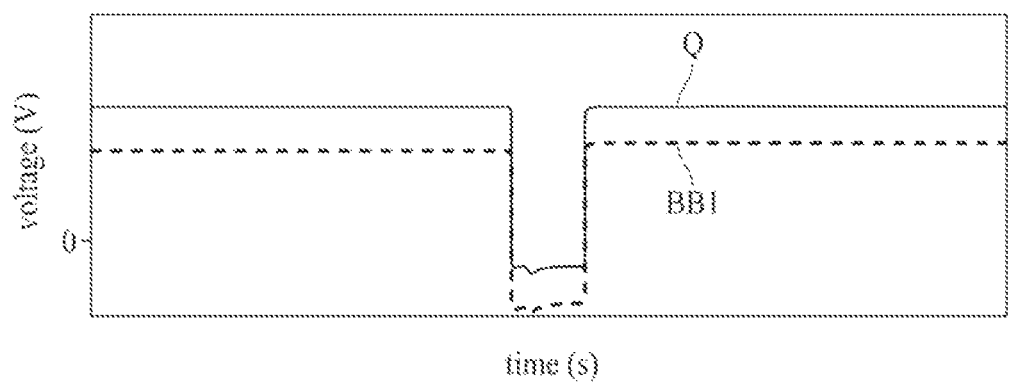
FIGS. 10A and 10B are voltage waveform diagrams of Q, BB1, QB, and BB2 nodes shown in FIG. 7.
Figure 10B:
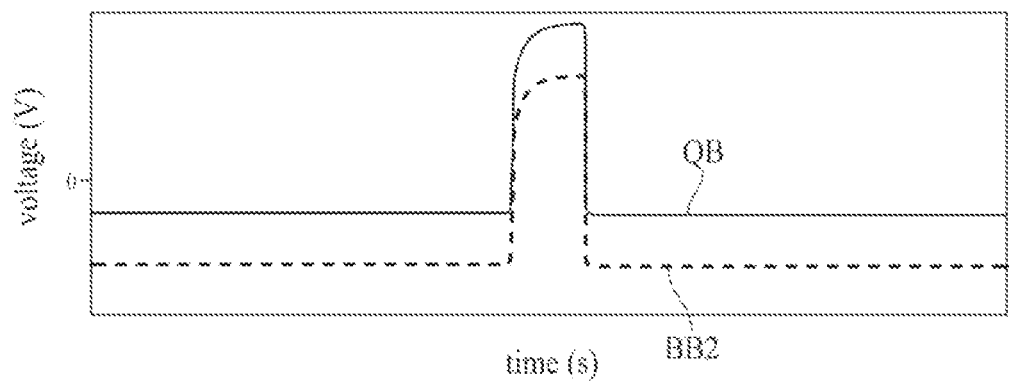

FIGS. 10A and 10B are voltage waveform diagrams of Q, BB1, QB, and BB2 nodes shown in FIG. 7.

Referring to FIGS. 10A and 10B, the back bias nodes BB1 and BB2 coupled to the Q node and the QB node, respectively, have a voltage level lower than the voltage of each of the Q node and the QB node, and can vary according to the on-level and off-level of the Q node and the QB node.

Referring to FIGS. 7 and 8, during the periods T1, T2, and T4 when the Q node is at the off-level, the back bias node BB1 of the output buffer 238 can apply the second low potential power supply voltage VSS2, which is lower than the first low potential power supply voltage VSS1 of the source electrode, as the back gate bias voltage to the light shielding layer 112A of the turned-off pull-up transistor T6 and T6c. Accordingly, the threshold voltage of the pull-up transistors T6 and T6c can be shifted to a positive threshold voltage by application of a negative back gate-source voltage −Vbs, thereby reducing leakage current and power consumption of the pull-up transistors T6 and T6c.

During the periods T1, T2, and T4 when the Q node is at the off-level, the shift amount in the positive direction of the threshold voltage of the pull-up transistor T6 and T6c can be determined based on the negative back gate-source voltage (−Vbs=VSS2−VSS1) and the thickness ratio of the buffer film 114 and the gate insulating film 118.

For example, as the back gate bias voltage VSS2 applied to the light shielding layer 112A is lower than the source voltage VSS1 of the pull-up transistors T6 and T6c, the positive shift level of the threshold voltage of the pull-up transistor T6 and T6c can be increased.

As the thickness of the buffer film 114 is reduced in the pull-up transistors T6 and T6c, the effect of the back gate bias voltage VSS2 applied to the light shielding layer 112A increases, whereby the positive shift level of the threshold voltage of the pull-up transistors T6 and T6c can be increased. In contrast, as the thickness of the gate insulating film 118 is reduced in the pull-up transistors T6 and T6c, the effect of the back gate bias voltage VSS2 applied to the light shielding layer 112A decreases, whereby the positive shift level of the threshold voltage of the pull-up transistor T6 and T6c can be reduced.

During the periods T3 and T5 when the Q node is at the on-level, the back bias node BB1 of the output buffer 238 can be coupled to the Q node to apply the elevated voltage to the light shielding layer 112A of the pull-up transistors T6 and T6c. Accordingly, the gate electrode 120 and the light shielding layer 112A of the pull-up transistors T6 and T6c can operate as a double gate to improve a current capability of the pull-up transistors T6 and T6c. Therefore, as the rising time of the emission control signal EM(N) and the carry output CR(N) can be reduced, a channel width of the pull-up transistors T6 and T6c can be reduced compared to the related art.

On the other hand, during the periods T3 and T5 when the Q node is at the on-level, when the back bias node BB1 of the output buffer 238 is coupled to the Q node through the capacitor C2, the coupling becomes difficult according to the increase of a parasitic capacitance related with the back bias node BB1, whereby the voltage of the back bias node BB1 can be reduced. The parasitic capacitance related with the back bias node BB1 can be determined by the overlap of the light shielding layer 112A and the semiconductor layer 116 of the pull-up transistor T6 and T6c.

Figure 11:
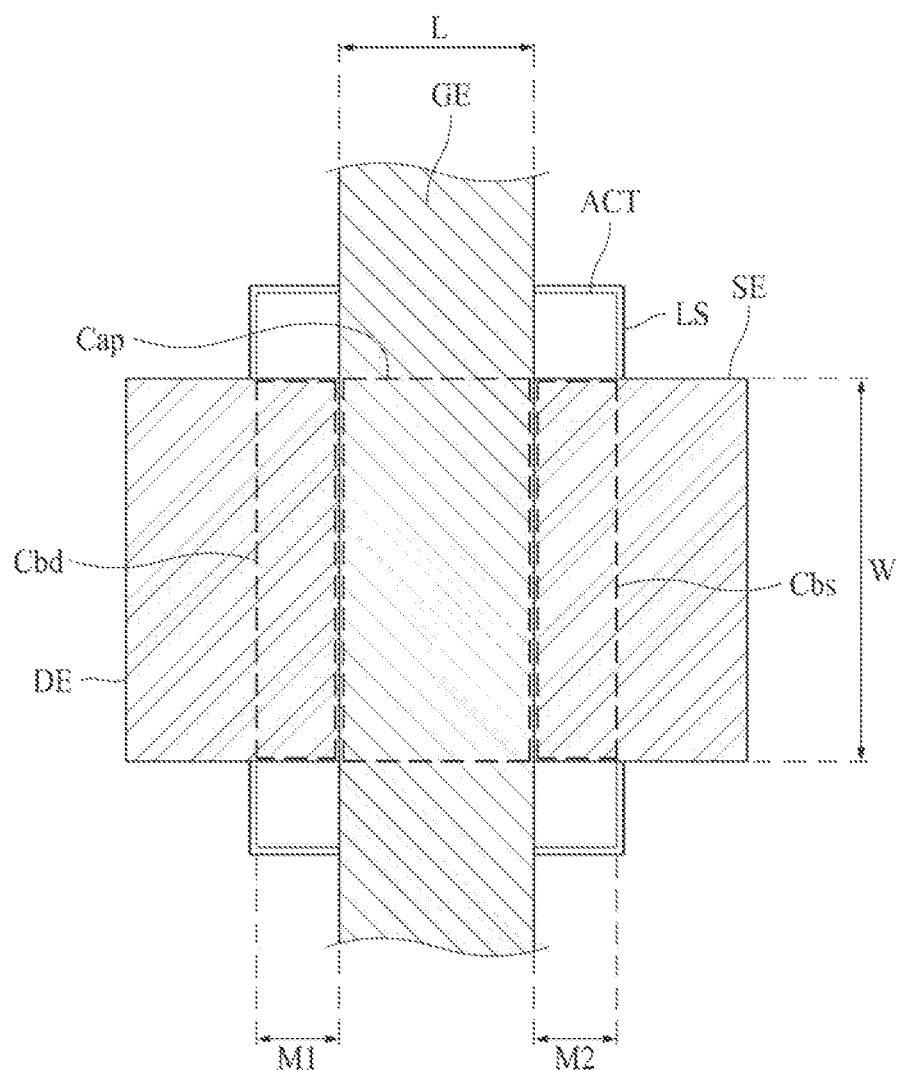
FIG. 11 is a diagram illustrating a simplified plan arrangement structure of a pull-up transistor according to one embodiment of the present disclosure.
Figure 12:
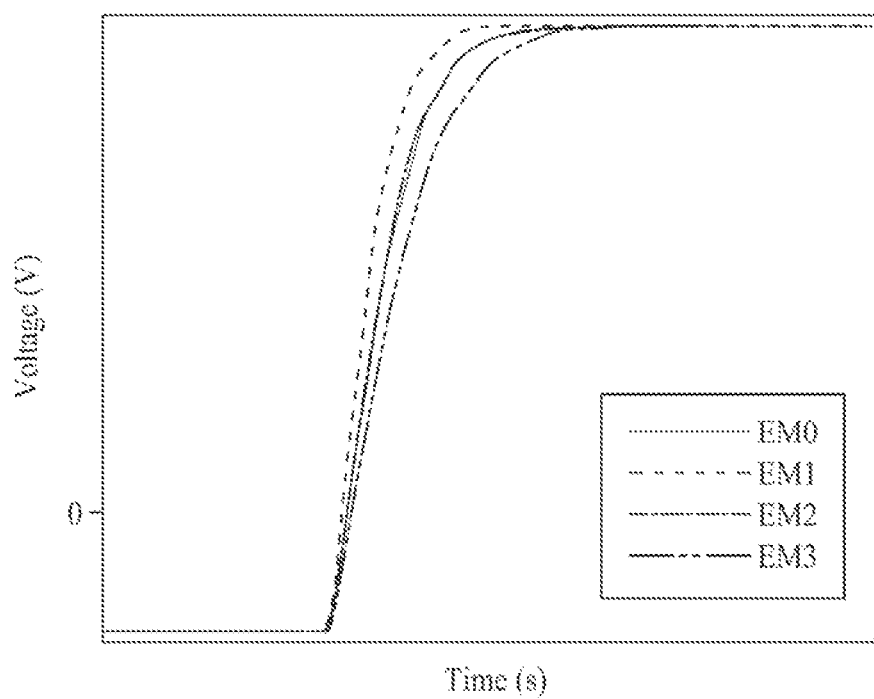
FIG. 12 is a graph showing an effect of reducing rising time of an emission control signal output from the emission control driver according to one embodiment of the present disclosure.

FIG. 11 is a diagram illustrating a simplified plan arrangement structure of the pull-up transistor according to one embodiment of the present disclosure, and FIG. 12 is a graph showing an effect of reducing the rising time of the emission control signal output from the emission control driver according to one embodiment of the present disclosure.

Referring to FIG. 11, the parasitic capacitance of the pull-up transistor related with the back bias node BB1 can include a back channel capacitance Cap generated in an overlapping region between the light shielding layer LS and a channel region of an active layer ACT overlapped with the gate electrode GE, and a capacitance Cbs and Cbd generated in an overlapping region between the light shielding layer LS and each conductive region of the active layer ACT connected with each of the source electrode SE and the drain electrode DE. The back channel capacitance Cap can be determined by multiplying a channel width W and a channel length L, and the capacitance Cbs and Cbd can be determined by multiplying a channel width W and an overlap margin M1 and M2 between the light shielding layer LS and the conductive region of the active layer ACT.

Accordingly, if the channel width W or the overlap margin M1 and M2 between the light shielding layer LS and the conductive region of the active layer ACT is reduced, the parasitic capacitance related with the back bias node BB1 can be reduced, so that it is possible to improve the current capability of the pull-up transistor T6 and T6c by increasing the voltage of the back bias node BB1 coupled to the Q node of the on-level.

Referring to FIG. 12, with respect to the rising time (reference rising time) of the emission control signal EM0 measured when the back bias voltage is not applied to the pull-up transistor T6 and it has a first channel width, the rising time of the emission control signal EM1 measured when the back bias voltage is applied to the pull-up transistor T6 and it has the first channel width is reduced, and the rising time of the emission control signal E2 measured when the back bias voltage is applied to the pull-up transistor T6 and it has a second channel width relatively smaller than the first channel width is similar to the reference rising time. The rising time of the emission control signal EM3 measured when the back bias voltage is applied to the pull-up transistor T6 and it has a third channel width relatively smaller than the second channel width is increased in comparison to the reference rising time.

Accordingly, it is known that the channel width is reduced when the back bias voltage is applied to the pull-up transistor T6 and T6c.

Figure 13A:
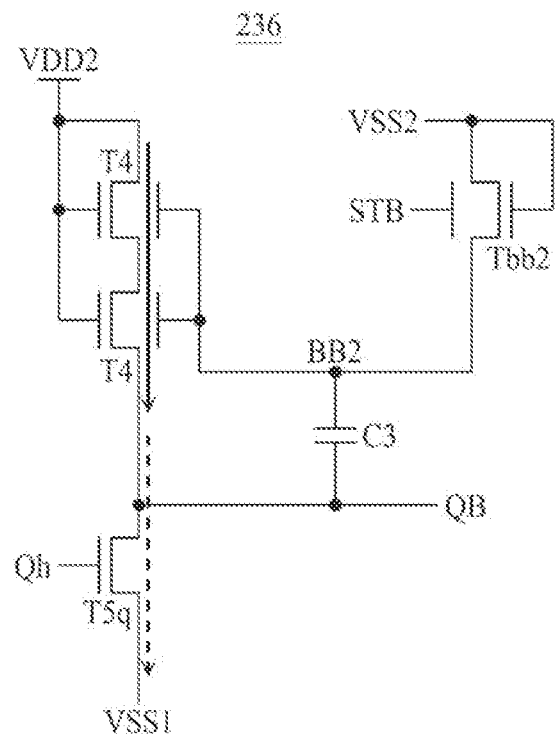
FIGS. 13A and 13B are diagrams illustrating a charging/discharging operation of an inverter according to one embodiment of the present disclosure.
Figure 13B:
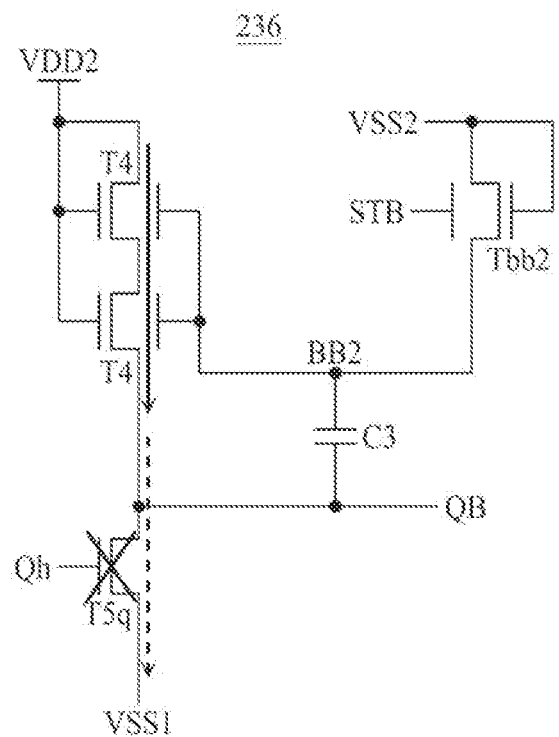

FIGS. 13A and 13B are diagrams illustrating a charging/discharging operation of the QB node by the inverter according to one embodiment of the present disclosure.

Referring to FIGS. 8 and 13A, when both the charge transistor T4 and the discharge transistor T5q of the inverter 236 are turned-on, the QB node can be deactivated to the off-level by the first low potential power supply voltage VSS1. During the period (T1+T2+T3+T5=Total−T4) when the QB node is at the off-level, the back bias node BB2 of the inverter 236 can apply the second low potential power supply voltage VSS2, which is lower than the first low potential power supply voltage VSS1 of the source electrode, as the back gate bias voltage to the light shielding layer 112A of the charge transistor T4. Accordingly, the threshold voltage of the charge transistor T4 can be shifted to a positive threshold voltage by the application of a negative back gate-source voltage −Vbs, to thereby reduce a current consumption.

Referring to FIGS. 8 and 13B, when the charge transistor T4 of the inverter 236 is turned-on and the discharge transistor T5q is turned-off, the QB node can be activated to the on-level by the second high potential power supply voltage VDD2. During the period T4 when the QB node is at the on-level, the back bias node BB2 of the inverter 236 can be coupled to the QB node to apply the elevated voltage to the light shielding layer 112A of the charge transistor T4. Accordingly, the gate electrode 120 and the light shielding layer 112A of the charge transistor T4 operate as a double gate to improve the current capability of the charge transistor T4, thereby simplifying a circuit configuration of the inverter 236. Also, even though the voltage of the back bias node BB2 is elevated according to the on-level of the QB node, the elevated voltage is lower than the voltage of the QB node corresponding to the source voltage of the charge transistor T4 so that the voltage is shifted to the positive threshold voltage by the negative back gate-source voltage −Vbs, to thereby reduce power consumption.

Figure 14A:
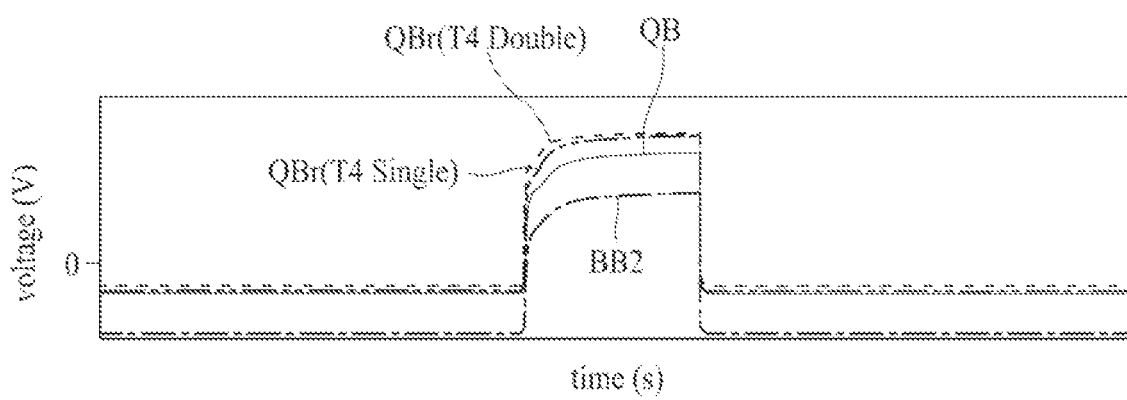
FIGS. 14A and 14B are graphs showing a power consumption reduction effect of the inverter in the emission control driver according to one embodiment of the present disclosure.
Figure 14B:
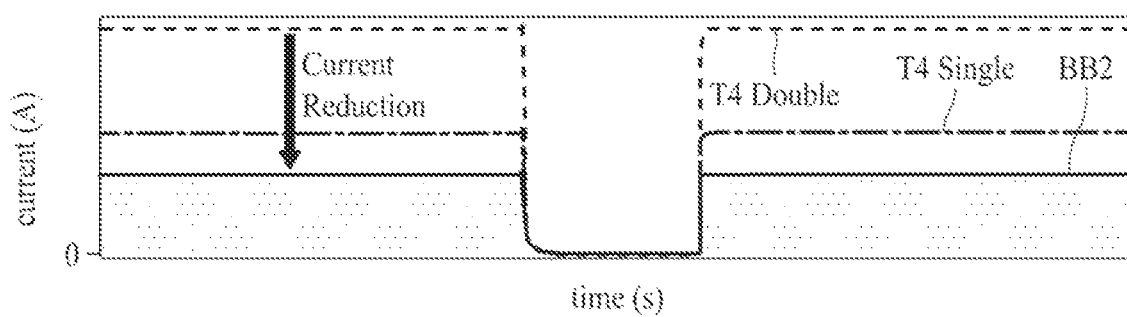

FIGS. 14A and 14B are graphs showing a power consumption reduction effect of the inverter in the emission control driver according to one embodiment of the present disclosure.

Referring to FIG. 14A, when the back bias voltage of the back bias node BB2 coupled to the QB node is applied to the light shielding layer 112A of the pair of charge transistors T4 in the inverter 236, the voltage of the QB node is sufficiently increased to the on-level. Without the application of the back bias voltage, the on-level of the QB node coupled to the back bias node BB2 according to one embodiment of the present disclosure can be somewhat lower than the on-level of the QB node (QBr) when the charge transistor T4 is a double gate structure or a single gate structure, however, can be normally operated as the on-level for the turn-on operation of the pull-down transistors T7 and T7c.

Referring to FIG. 14B, the consumption current generated during the off-level period of the QB node is relatively high in the inverter using the charge transistor T4 of the double gate structure or the single gate structure without applying the back bias node BB2. On the other hand, in the inverter 236 according to one embodiment of the present disclosure, the threshold voltage of the charge transistor T4 is shifted in the positive direction owing to the back bias effect by the back bias node BB2, so that the current consumption occurring during the off-level period of the QB node is remarkably low.

As described above, the emission control driver according to one embodiment of the present disclosure can shift the threshold voltage of at least one TFT to the positive threshold voltage and reduce leakage current and power consumption by applying the back gate bias voltage, which is lower than the source voltage, to the light shielding layer of the at least one TFT during the off-level of the Q node and the QB node through the back bias node individually coupled to the Q node and the QB node.

According to one embodiment of the present disclosure, the emission control driver operates at least one TFT in the double gate structure by increasing the voltage of the light shielding layer of at least one TFT during the on-level of each of the Q node and the QB node through the back bias node individually coupled to the Q node and the QB node, thereby improving the current capability.

Accordingly, the emission control driver, the display panel, and the display device according to one embodiment of the present disclosure can reduce the bezel area by simplifying the circuit configuration of the emission control driver and reducing the size of the emission control driver.

The emission control driver, the display panel, and the display device comprising the same according to one or more embodiments of the present disclosure can be applied to various electronic devices. For example, the emission control driver, the display panel, and the display device comprising the same according to one embodiment of the present disclosure can be applied to a mobile device, a video phone, a smart watch, a watch phone, a wearable device, a foldable device, a rollable device, a bendable device, a flexible device, a curved device, an electronic diary, electronic book, a portable multimedia player (PMP), a personal digital assistant(PDA), MP3 player, a mobile medical device, a desktop PC, a laptop PC, a netbook computer, a workstation, a navigator, a vehicle navigator, a vehicle display device, a television, a wall paper display device, a signage device, a game device, a notebook computer, a monitor, a camera, a camcorder, and home appliances.

In addition to the above-mentioned advantageous effects of the present disclosure, other features and advantages of the present disclosure will be clearly understood by those skilled in the art from the above description or explanation. Furthermore, features, structures, effects and so on exemplified in at least one example of the present disclosure can be implemented by combining or modifying other examples by a person having ordinary skilled in this field. Therefore, contents related to such combinations and modifications should be interpreted as being included in the scope of the present application.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

What is claimed is:

1. A display device comprising:
    a display panel configured to display an image through sub pixels; and
    an emission control driver configured to supply a plurality of emission control signals to the sub pixels,
    wherein the emission control driver includes a plurality of emission control stages configured to supply the plurality of emission control signals, respectively,
    wherein each of the plurality of emission control stages includes:
        an output buffer including a first pull-up transistor configured to output a first high potential power supply voltage to an output line by a first control node, and a first pull-down transistor configured to output a first low potential power supply voltage to the output line by a second control node;
        a charge/discharge part configured to charge and discharge the first control node by using a charge/discharge signal in response to a clock signal;
        an inverter configured to charge and discharge the second control node to be opposite to the first control node;
        a first back bias circuit configured to apply a first back bias voltage to a light shielding layer of at least one transistor of the output buffer through a first back bias node capacitance-coupled to the first control node; and
        a second back bias circuit configured to apply a second back bias voltage to a light shielding layer of at least one transistor of the inverter through a second back bias node capacitance-coupled to the second control node, and
    wherein the first back bias circuit includes:
        the first back bias node connected to the light shielding layer of the first pull-up transistor of the output buffer;
        a first capacitor connected between the first control node and the output line: and
        a first back bias transistor configured to initialize the first back bias node to a second low potential power supply voltage, which is lower than the first low potential power voltage, during a vertical blank pend of each frame by a stabilization signal, and float the first back bias node during an active period of each frame.

2. The display device according to claim 1,
    wherein, during an off-level period of the first control node, the first back bias node applies the second low potential power supply voltage as the first back bias voltage to the light shielding layer of the first pull-up transistor, and
    during an on-level period of the first control node, the first back bias node applies the voltage elevated according to the on-level of the first control node to the light shielding layer of the first pull-up transistor.

3. The display device according to claim 1,
    wherein the output buffer further includes:
    a second pull-up transistor configured to output a second high potential power supply voltage to a carry output line by the first control node; and
    a second pull-down transistor configured to output the first low potential power supply, voltage to the carry output line by the second control node, and
    wherein the first back bias node is connected to the light shielding layer of the second pull-up transistor.

4. The display device according to claim 3,
    wherein, during an off-level period of the first control node, the first back bias node applies the second low potential power supply voltage as the first back bias voltage to the light shielding layer of the second pull-up transistor, and
    during an on-level period of the first control node, the first back bias node applies the voltage elevated according to the on-level of the first control node to the light shielding layer of the second pull-up transistor.

5. The display device according to claim 1,
    wherein the first back bias transistor includes:
    a light shielding layer to which the stabilization signal is supplied;
    a gate electrode and a drain electrode to which the second low potential power supply, voltage is supplied; and
    a source electrode connected to the first back bias node.

6. The display device according to claim 1,
    wherein the second back bias circuit includes:
    the second back bias node connected to the light shielding layer of a charge transistor in the inverter;
    a second capacitor connected between the second control node and the second back bias node; and
    a second back bias transistor configured to initialize the second back bias node to the second low potential power supply voltage during the vertical blank period by the stabilization signal, and float the second back bias node during the active period.

7. The display device according to claim 6,
    wherein, during an off-level period of the second control node, the second back bias node applies the second low potential power supply voltage as the second back bias voltage to the light shielding layer of the charge transistor, and
    during an on-level period of the second control node, the second back bias node applies the voltage elevated according to the on-level of the second control node to the light shielding layer of the charge transistor.

8. The display device according to claim 6,
    wherein the second back bias transistor includes:
    a light shielding layer to which the stabilization signal is supplied;
    a gate electrode and a drain electrode to which the second low potential power supply voltage is supplied; and
    a source electrode connected to the second back bias node.

9. The display device according to claim 1,
wherein the charge/discharge part includes a pair of charge/discharge transistors controlled by the clock signal supplied through a clock line, and connected in series between the first control node and an input line to which the charging/discharging signal is supplied, and
wherein the charge/discharge signal is supplied with any one of the carry output of the preceding emission control stage and a start pulse.

10. The display device according to claim 9,
wherein each emission control stage further includes a leakage prevention part having a charge transistor controlled by the first control node and configured to charge the second high potential power supply voltage to an intermediate node between the pair of charge/discharge transistors and a third control node of the inverter.

11. The display device according to claim 10,
wherein the inverter includes:
a pair of charge transistors connected in a diode structure between a second power line to which the second high potential power supply voltage is supplied and the second control node in series; and
a discharge transistor controlled by the third control node and connected between the second control node and a third power line supplied with the first low potential power supply voltage, and
wherein the second back bias node is connected to a light shielding layer in each of the pair of charge transistors of the inverter.

12. The display device according to claim 1, further comprising:
a first scan driver configured to supply a plurality of first scan signals to a plurality of first gate lines connected to the sub pixels; and
a second scan driver configured to supply a plurality of second scan signals to a plurality of second gate lines connected to the sub pixels.

13. The display device according to claim 12,
wherein the emission control driver supplies the plurality of emission control signals to a plurality of third gate lines connected to the sub pixels, or
wherein the first scan driver, the second scan driver, and the emission control driver are embedded in the display panel, or
wherein the display panel includes a display area displaying the image and a bezel area surrounding the display area; and the first scan driver, the second scan driver, and the emission control driver are embedded in the bezel area.

14. The display device according to claim 1,
wherein the first pull-up transistor includes the light shielding layer on a substrate, a buffer film coveting the light shielding layer and a semiconductor layer disposed on the buffer film, and
wherein a gate electrode of the first pull-up transistor is connected with the first control node, and the gate electrode and the light shielding layer of the first pull-up transistor operate as a double gate of the first pull-up transistor.

15. The display device according to claim 11,
wherein the pair of charge transistors include the light shielding layer on a substrate, a buffer film covering the light shielding layer and a semiconductor layer disposed on the pair of charge transistors, and wherein a gate electrode of each of the pair of charge transistors is connected with the second power line, and the gate electrode and the light shielding layer of each of the pair of charge transistors operate as a double gate of each of the pair of charge transistors.

16. A display panel comprising:
a display area configured to display an image through sub pixels;
a bezel area surrounding or being adjacent to the display area;
a first scan driver embedded in the bezel area and configured to supply a plurality of first scan signals to a plurality of first gate lines connected to the sub pixels;
a second scan driver embedded in the bezel area and configured to supply a plurality of second scan signals to a plurality of second gate lines connected to the sub pixels; and
an emission control driver embedded in the bezel area and configured to supply a plurality of emission control signals to a plurality of third gate lines connected to the sub pixels,
wherein the emission control driver includes a plurality of emission control stages configured to supply the plurality emission control signals, respectively, and
wherein each of the plurality of emission control stages includes:
an output buffer including:
a first pull-up transistor configured to output a first high potential power supply voltage to an output line by a first control node,
a second pull-up transistor configured to output a second high potential power supply voltage to a carry output line by the first control node,
a first pull-down transistor configured to output a first low potential power supply voltage to the output line by a second control node, and
a second pull-down transistor configured to output the first low potential power supply voltage to the carry output line by the second control node;
a charge/discharge part configured to charge and discharge the first control node by using a charge/discharge signal in response to a clock signal;
an inverter configured to charge and discharge the second control node to be opposite to the first control node;
a first back bias circuit configured to apply a first back bias voltage to a light shielding layer of at least one transistor of the output buffer through a first back bias node capacitance-coupled to the first control node; and
a second back bias circuit configured to apply a second back bias voltage to a light shielding layer of at least one transistor of the inverter through a second back bias node capacitance-coupled to the second control node, and
wherein the first back bias circuit includes:
the first back bias node connected to the light shielding layer of at least one of the first and second pull-up transistors of the output buffer;
a first capacitor connected between the first control node and the first back bias node; and
a first back bias transistor configured to initialize the first back bias node to a second low potential power supply voltage, which is lower than the first low potential power voltage, during a vertical blank period of each frame by a stabilization signal, and floating the first back bias node during an active period of each frame.

17. The display panel according to claim 16,
wherein the second hack bias circuit includes:
the second back bias node connected to the light shielding layer of at least one of charge transistor in the inverter;
a second capacitor connected between the second control node and the second back bias node; and
a second back bias transistor configured to initialize the second back bias node to the second low potential power supply voltage during the vertical blank period by the stabilization signal, and float the second hack bias node during the active period.

18. The display panel according to claim 16,
wherein the inverter includes:
a pair of charge transistors connected in a diode structure between a second power line to which the second high potential power supply voltage is supplied and the second control node in series; and
a discharge transistor controlled by a third control node and connected between the second control node and a third power line supplied with the first low potential power supply voltage, and
wherein the second back bias node is connected to a light shielding layer in each of the pair of charge transistors of the inverter.

19. The display device according to claim 16,
wherein the first pull-up transistor includes the light shielding layer on a substrate, a buffer film covering the light shielding layer and a semiconductor layer disposed on the buffer film, and
wherein a gate electrode of the first pull-up transistor is connected with the first control node, and the gate electrode and the light shielding layer of the first pull-up transistor operate as a double gate of the first pull-up transistor.

\* \* \* \* \*